United States Patent
Ohmori et al.

(10) Patent No.: US 12,372,815 B2
(45) Date of Patent: Jul. 29, 2025

(54) LASER IRRADIATION APPARATUS, LASER IRRADIATION METHOD, AND RECORDING MEDIUM RECORDING PROGRAM TO BE READABLE

(71) Applicant: JSW Aktina System Co., Ltd., Yokohama (JP)

(72) Inventors: Kenichi Ohmori, Yokohama (JP); Yuzaburo Ohta, Yokohama (JP); Rei Matsushita, Yokohama (JP)

(73) Assignee: JSW Aktina System Co., Ltd., Yokohama (JP)

( * ) Notice: Subject to any disclaimer, the term of this patent is extended or adjusted under 35 U.S.C. 154(b) by 543 days.

(21) Appl. No.: 17/743,900

(22) Filed: May 13, 2022

(65) Prior Publication Data
US 2023/0011292 A1   Jan. 12, 2023

(30) Foreign Application Priority Data
Jul. 12, 2021   (JP) .................. 2021-115142

(51) Int. Cl.
*G02F 1/01* (2006.01)
*G01J 1/42* (2006.01)
(Continued)

(52) U.S. Cl.
CPC .......... *G02F 1/0121* (2013.01); *G01J 1/4257* (2013.01); *H01S 3/0085* (2013.01);
(Continued)

(58) Field of Classification Search
CPC .. G02F 1/0121; G02F 2203/48; G01J 1/4257; G01J 1/0418; G01J 1/0429; G01J 1/26;
(Continued)

(56) References Cited

U.S. PATENT DOCUMENTS

| | | | |
|---|---|---|---|
| 2006/0194354 A1* | 8/2006 | Okumura | H01L 21/02678 257/E21.531 |
| 2011/0027918 A1* | 2/2011 | Tanaka | H10K 50/19 356/237.1 |

(Continued)

FOREIGN PATENT DOCUMENTS

| | | |
|---|---|---|
| JP | 2000-504498 A | 4/2000 |
| JP | 2002-9012 A | 1/2002 |

(Continued)

OTHER PUBLICATIONS

Notice of Reasons for Refusal for Japanese Application No. 2021-115142 mailed Jan. 28, 2025, with its machine translation, 9 pages.

*Primary Examiner* — Mariam Qureshi
(74) *Attorney, Agent, or Firm* — Christian S. Hans; Bret E. Field; Bozicevic, Field & Francis LLP

(57) ABSTRACT

A laser irradiation apparatus including a laser light source includes a first detection unit and a second detection unit configured to detect luminance of a substrate irradiated with laser light from the laser light source, and a control unit configured to perform control related to laser light emitted from the laser light source, in which the control unit specifies an energy density of laser light based on luminance detected by the first detection unit, specifies reference luminance based on a specified energy density and luminance detected by the second detection unit, and changes an energy density of laser light according to the reference luminance and luminance detected by the second detection unit.

14 Claims, 10 Drawing Sheets

(51) Int. Cl.
    *H01L 21/02*     (2006.01)
    *H01S 3/00*     (2006.01)
    *H01S 3/225*     (2006.01)

(52) U.S. Cl.
    CPC .... *G02F 2203/48* (2013.01); *H01L 21/02678* (2013.01); *H01L 21/02686* (2013.01); *H01L 21/02691* (2013.01); *H01S 3/225* (2013.01)

(58) Field of Classification Search
    CPC .......... G01J 1/32; H01S 3/0085; H01S 3/225; H01L 21/02678; H01L 21/02686; H01L 21/02691; H01L 21/67115; H01L 21/268
    See application file for complete search history.

(56) References Cited

U.S. PATENT DOCUMENTS

2013/0341310 A1* 12/2013 Van Der Wilt .... G01N 21/4788
                                                219/121.62
2019/0371682 A1* 12/2019 Suzuki ............... G01R 31/2836

FOREIGN PATENT DOCUMENTS

| | | |
|---|---|---|
| JP | 2003-163167 A | 6/2003 |
| JP | 2012-15545 A | 1/2012 |
| WO | WO9824118 A1 | 6/1998 |

\* cited by examiner

F I G. 4
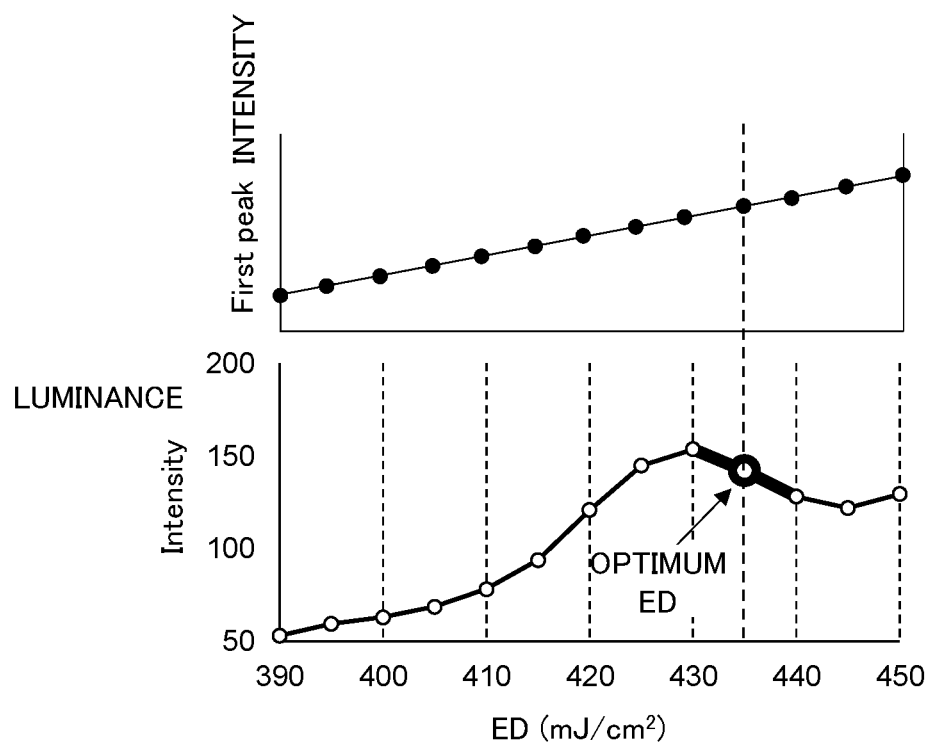

F I G. 6
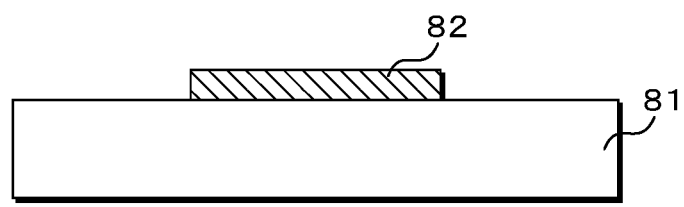

F I G. 7
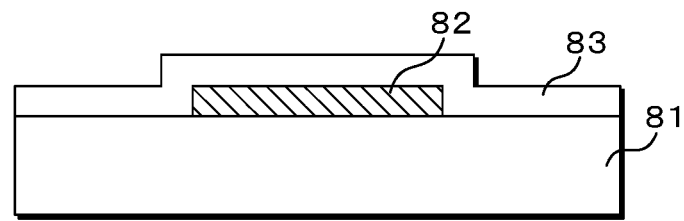

F I G. 8
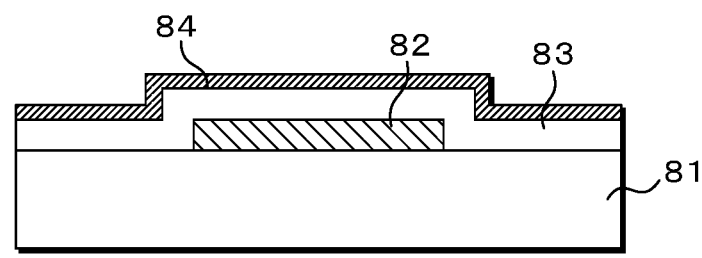

F I G. 1 0
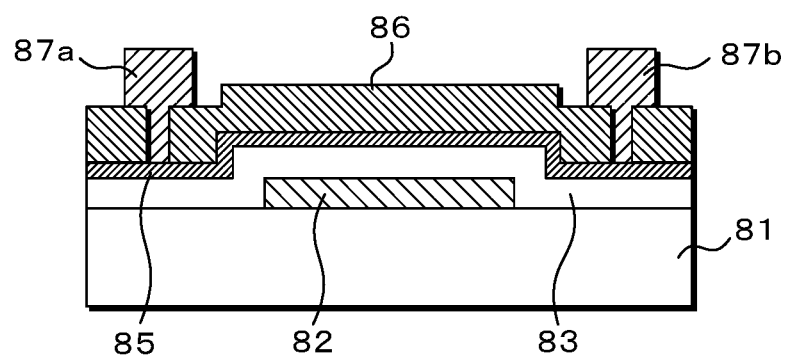

LASER IRRADIATION APPARATUS, LASER IRRADIATION METHOD, AND RECORDING MEDIUM RECORDING PROGRAM TO BE READABLE

CROSS-REFERENCE TO RELATED APPLICATION

This Non-provisional application claims priority under 35 U.S.C § 119(a) on Patent Application No. 2021-115142 filed in Japan on Jul. 12, 2021, the entire contents of which are hereby incorporated by reference.

FIELD

The present invention relates to a laser irradiation apparatus, a laser irradiation method, and a recording medium recording a program to be readable.

BACKGROUND

A laser annealing apparatus for forming a polycrystalline silicon thin film has been known (for example, Japanese Patent Laid-Open Publication No. 2012-15545).

The laser annealing apparatus described in Japanese Patent Laid-Open Publication No. 2012-15545 includes a waveform shaping device that shapes a waveform of a laser light pulse, and a polycrystalline silicon thin film is formed by irradiating an amorphous silicon film with laser light formed in a line shape by the waveform shaping device.

However, the laser annealing apparatus of Japanese Patent Laid-Open Publication No. 2012-15545 does not take into consideration a point of dealing with a fluctuation in a pulse waveform of laser light in a process of forming the polycrystalline silicon thin film.

SUMMARY

The invention has been made in view of such circumstances, and an object of the invention is to provide a laser irradiation apparatus, etc. capable of efficiently dealing with a fluctuation in a pulse waveform of laser light.

A laser irradiation apparatus according to this aspect is a laser irradiation apparatus including a laser light source, the laser irradiation apparatus including a first detection unit and a second detection unit configured to detect luminance of a substrate irradiated with laser light from the laser light source, and a control unit configured to perform control related to laser light emitted from the laser light source, in which the control unit specifies an energy density of laser light based on luminance detected by the first detection unit, specifies reference luminance based on a specified energy density and luminance detected by the second detection unit, and changes an energy density of laser light according to the reference luminance and luminance detected by the second detection unit when a substrate is irradiated with laser light at a specified energy density.

A laser irradiation method according to this aspect causes a computer that performs control related to laser emitted from a laser light source and is communicably connected to a first detection unit and a second detection unit configured to detect luminance of a substrate irradiated with laser light from the laser light source to execute processes of (A) specifying an energy density of laser light based on luminance detected by the first detection unit, (B) specifying reference luminance based on a specified energy density and luminance detected by the second detection unit, and (C) changing an energy density of laser light according to the reference luminance and luminance detected by the second detection unit when a substrate is irradiated with laser light at a specified energy density.

A program according to this aspect causes a computer that performs control related to laser emitted from a laser light source and is communicably connected to a first detection unit and a second detection unit configured to detect luminance of a substrate irradiated with laser light from the laser light source to execute processes of (A) specifying an energy density of laser light based on luminance detected by the first detection unit, (B) specifying reference luminance based on a specified energy density and luminance detected by the second detection unit, and (C) changing an energy density of laser light according to the reference luminance and luminance detected by the second detection unit when a substrate is irradiated with laser light at a specified energy density.

According to the invention, it is possible to provide a laser irradiation apparatus, etc. capable of efficiently dealing with a fluctuation in a pulse waveform of laser light.

BRIEF DESCRIPTION OF SEVERAL VIEWS OF DRAWINGS

FIG. 4 is an explanatory diagram illustrating a result of detecting luminance by an unevenness monitor;

FIG. 6 is a process sectional view illustrating a method of manufacturing a semiconductor device according to another embodiment (method of manufacturing a semiconductor device);

FIG. 7 is a process sectional view illustrating the method of manufacturing the semiconductor device according to the another embodiment (method of manufacturing the semiconductor device);

FIG. 8 is a process sectional view illustrating the method of manufacturing the semiconductor device according to the another embodiment (method of manufacturing the semiconductor device);

FIG. 10 is a process sectional view illustrating the method of manufacturing the semiconductor device according to the another embodiment (method of manufacturing the semiconductor device).

DETAILED DESCRIPTION

First Embodiment

Figure 1:
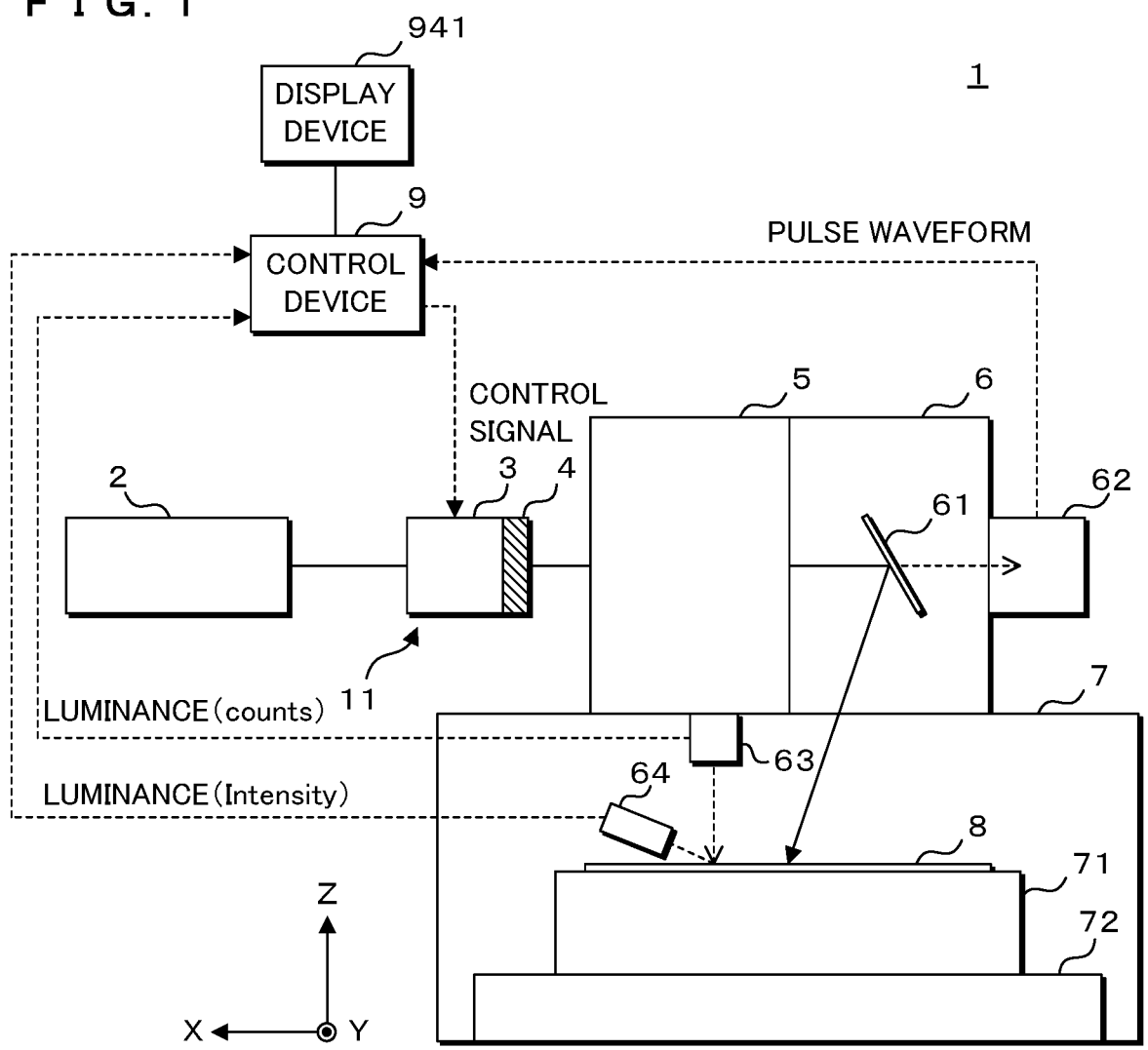
FIG. 1 is a diagram illustrating a configuration example of a laser annealing apparatus according to a first embodiment.
Figure 2:
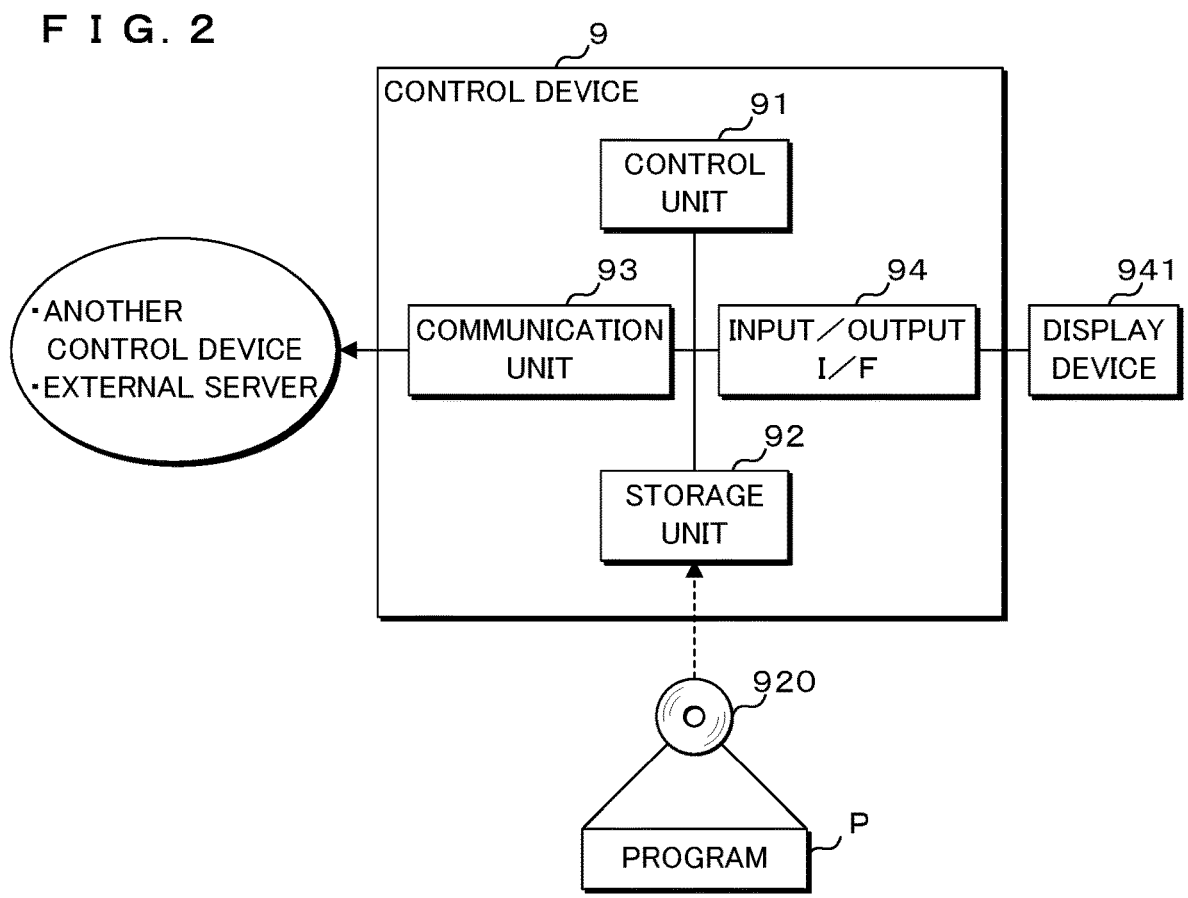
FIG. 2 is a diagram illustrating a configuration example of a control device included in the laser annealing apparatus.

Hereinafter, embodiments of the invention will be described. FIG. 1 is a diagram illustrating a configuration example of a laser annealing apparatus 1 according to a first embodiment. FIG. 2 is a diagram illustrating a configuration example of a control device 9 included in the laser annealing apparatus 1. The laser annealing apparatus 1 (laser irradiation apparatus) is, for example, an excimer laser annealing (ELA) apparatus for forming a low temperature poly-silicon (LTPS) film.

The laser annealing apparatus 1 irradiates a silicon film formed on a substrate 8 with laser light. In this way, it is possible to convert an amorphous silicon film (a-Si film) into a polycrystalline silicon film (polysilicon film: p-Si film). For example, the substrate 8 is a transparent substrate such as a glass substrate.

As illustrated in the figure of the present embodiment, in a XYZ three-dimensional Cartesian coordinate system, a Z-direction is a vertical direction and is a direction perpendicular to the substrate 8. An XY-plane is a plane parallel to a plane on which the silicon film of the substrate 8 is formed. For example, an X-direction is a longitudinal direction of the rectangular substrate 8, and a Y-direction is a lateral direction of the substrate 8. When using a Θ-axis stage 71 that can rotate from 0° to 90° about a Z-axis, the X-direction can be the lateral direction of the substrate 8 and the Y direction can be the longitudinal direction of the substrate 8.

The laser annealing apparatus 1 includes an annealing optical system 11, a laser irradiation chamber 7, and a control device 9. The laser irradiation chamber 7 accommodates a base 72 and the stage 71 disposed on the base 72. In the laser annealing apparatus 1, while the substrate 8 is conveyed in a +X-direction by the stage 71, the silicon film is irradiated with laser light. The laser annealing apparatus 1 further includes a biplanar phototube 62, an OED sensor 63 (first detection unit), and an unevenness monitor 64 (second detection unit) as detection units for detecting information related to emitted laser light.

The annealing optical system 11 is an optical system for generating laser light for crystallizing an amorphous silicon film formed on the substrate 8 and converting the amorphous silicon film into a polysilicon film, and irradiating the amorphous silicon film with the laser light. The annealing optical system 11 includes a laser light source 2, an attenuator 3, a polarization ratio control unit 4, a beam shaping optical system 5, and an epi-illumination mirror 61, and emits line-shaped laser light.

The laser light source 2 is a laser generator that generates pulsed laser light as laser light for irradiating the amorphous silicon film (processed object). The generated laser light is laser light for crystallizing a non-crystalline film on the substrate 8 to form a crystallized film, and is, for example, gas laser light such as excimer laser light having a center wavelength of 308 nm. Alternatively, the gas laser light is not limited to the excimer laser light, and may be another gas laser such as a Co2 laser.

In the laser light source 2, a gas such as xenon is enclosed in a chamber, and two resonator mirrors are disposed to face each other with the gas interposed therebetween. One resonator mirror is a total reflection mirror that reflects all light, and the other resonator mirror is a partial reflection mirror that transmits a part of light. Gas light excited by the gas is repeatedly reflected between the resonator mirrors, and amplified light is emitted from the resonator mirror as laser light. For example, the laser light source 2 repeatedly emits pulsed laser light in a cycle of 500 Hz to 600 Hz. The laser light source 2 emits the laser light toward the attenuator 3.

The attenuator 3 attenuates incident laser light to adjust an energy density to a predetermined energy density. As a characteristic, the attenuator has a transmittance indicating a ratio of the emitted laser light to the incident laser light, and the transmittance is configured to be variable based on a signal from the control device 9. The attenuator 3 is provided in the middle of an optical path from the laser light source 2 to the beam shaping optical system 5. The attenuator 3 attenuates laser light emitted by the laser light source 2 according to the transmittance.

The density (E) of energy emitted from the attenuator 3 is a value (E=E0×T) obtained by multiplying the density (E0) of energy of laser light emitted from the laser light source 2 by a transmittance (T) of the attenuator 3. Although details will be described later, the control device 9 specifies (derives) and changes the transmittance of the attenuator 3 so that the density of energy emitted from the attenuator 3 becomes the optimum energy density.

The polarization ratio control unit 4 is disposed on an emission side of the attenuator 3. The polarization ratio control unit 4 includes, for example, a 1/2 wave plate (λ/2 plate) and a polarization beam splitter, and change a polarization ratio of a P-polarized wave and an S-polarized wave of incident laser light. That is, a polarization ratio of laser light emitted from the attenuator 3 is changed by the polarization ratio control unit 4. The polarization ratio control unit 4 is configured to change (vary) the polarization ratio based on a control signal output from the control device 9.

When the transmittance of the attenuator 3 is changed, the polarization ratio of the laser light emitted from the attenuator 3 is changed according to the transmittance. On the other hand, the control device 9 changes a polarization ratio of the polarization ratio control unit 4 according to the changed transmittance, thereby performing a control operation so that a polarization ratio of laser light emitted from the polarization ratio control unit 4 becomes constant.

Upon changing the polarization ratio of the polarization ratio control unit 4, for example, the control device 9 may specify (derive) the polarization ratio according to the transmittance with reference to information (polarization ratio table) stored in a storage unit 92 of the control device 9 in a table format. In the polarization ratio table, each polarization ratio corresponding to each transmittance is defined.

Laser light emitted from the polarization ratio control unit 4 is incident on the beam shaping optical system 5, and the beam shaping optical system 5 shapes the incident laser light to generate beam-shaped laser light suitable for irradiating a silicon film. The beam shaping optical system 5 generates a line-shaped line beam along the Y-direction.

The beam shaping optical system 5 divides one beam into a plurality of beams (a plurality of line beams arranged in the Z-direction) by, for example, a homogenizer including a lens array. After dividing into the plurality of beams, the beams may be shaped into a line beam shape by being synthesized using a condenser lens. The beam shaping optical system 5 emits the generated (shaped) line-shaped laser light to the epi-illumination mirror 61.

The epi-illumination mirror 61 is a rectangular reflection mirror extending in the −Y direction, and reflects laser light which is a plurality of line beams generated by the beam shaping optical system 5. The epi-illumination mirror 61 is, for example, a dichroic mirror, which is a partial reflection mirror that transmits a part of light. The epi-illumination mirror 61 reflects line-shaped laser light to generate reflected light, and at the same time, transmits a part of the line-shaped laser light to generate transmitted light. The epi-illumination mirror 61 irradiates the silicon film of the substrate 8 with laser light, which is reflected light, and emits laser light, which is transmitted light, to a pulse measuring instrument such as a biplanar phototube 62.

The biplanar phototube 62 is provided at an end of the annealing optical system 11 adjacent to the beam shaping optical system 5, and detects a pulse waveform of laser light emitted from the laser light source 2 based on transmitted light transmitted through the epi-illumination mirror 61. The biplanar phototube 62 outputs (transmits) the detected pulse waveform to the control device 9.

The OED sensor 63 (first detection unit) includes an optical sensor and detects reflected light (reflected light reflected by the substrate 8) of light emitted from a light source (separate light source) separate from the laser light source 2 to acquire information related to a crystal surface on the substrate 8. The OED sensor 63 outputs (transmits) luminance of the detected reflected light to the control device 9.

The unevenness monitor 64 (second detection unit) includes a line camera, photographs a region of interest of the substrate 8 irradiated with laser light using the line camera, detects average luminance of the region of interest contained in a photographed image, and acquires information related to scattered light of a surface shape of the substrate 8. The unevenness monitor 64 outputs (transmits) the detected average luminance of the substrate 8 (region of interest) to the control device 9.

In the present embodiment, it is assumed that the OED sensor 63 corresponds to the first detection unit and the unevenness monitor 64 corresponds to the second detection unit. However, the first detection unit and the second detection unit are limited to these sensors. It is possible to adopt a plurality of types of sensors that detects different physical quantities due to different measurement methods even when a measurement target has the same luminance.

The control device 9 is an information processing device such as a personal computer or a server device that controls or manages the laser annealing apparatus 1 as a whole or in an integrated manner. The control device 9 includes a control unit 91, a storage unit 92, a communication unit 93, and an input/output I/F 94, and is communicably connected to a control device (another control device) that controls each optical system in the laser light source 2 or the annealing optical system 11 via the communication unit 93 or the input/output I/F 94.

The control device 9 is communicably connected to various measurement devices (detection units) such as a pulse measuring instrument such as the biplanar phototube 62 and an optical detector such as the OED sensor 63 or the unevenness monitor 64 included in the laser annealing apparatus 1, and performs various control operations on the laser light source 2 or the annealing optical system 11 based on measurement data output from these various measurement devices (detection units). The control device 9 may be communicably connected to, for example, an external server connected to the Internet, etc. via the communication unit 93, and may perform various control-related processes in cooperation with the external server.

The control unit 91 has an arithmetic processing unit having a timing function such as one or a plurality of CPUs (Central Processing Units), MPUs (Micro-Processing Units), and GPUs (Graphics Processing Units), and performs various information processing and control processing for each optical system included in the laser light source 2 or the annealing optical system 11 by reading and executing a program P (program product) stored in the storage unit 92.

The storage unit 92 includes a volatile storage area such as a SRAM (Static Random Access Memory), a DRAM (Dynamic Random Access Memory), or a flash memory and a nonvolatile storage area such as an EEPROM or a hard disk. The storage unit 92 stores the program P (program product) and data to be referred to at the time of processing in advance. The program P stored in the storage unit 92 may be a program P (program product) read from a recording medium 920 readable by the control unit 91. Further, the program P (program product) may be downloaded from an external computer (not illustrated) connected to a communication network (not illustrated) and stored in the storage unit 92.

The communication unit 93 is, for example, a communication module or a communication interface conforming to an Ethernet (registered trademark) standard, and an Ethernet cable is connected to the communication unit 93. The communication unit 93 is not limited to the case where the Ethernet cable, etc. is wired, and may be, for example, a communication interface compatible with wireless communication such as a narrow-range wireless communication module such as Wi-Fi (registered trademark) or Bluetooth (registered trademark), or a wide-range wireless communication module such as 4G and 5G.

The input/output I/F 94 is a communication interface compliant with a communication standard such as RS232C or USB. An input device such as a keyboard or a display device 941 such as a liquid crystal display is connected to the input/output I/F 94.

Figure 3:
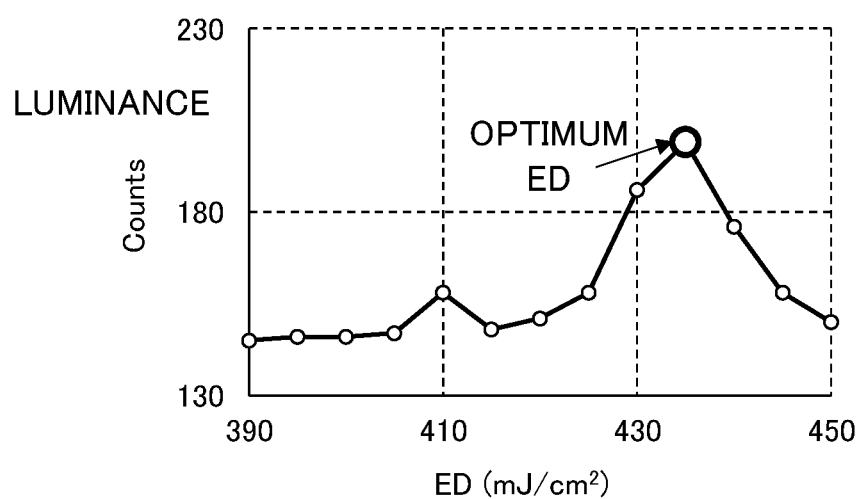
FIG. 3 is an explanatory diagram illustrating a result of detecting luminance by an OED sensor.

FIG. 3 is an explanatory diagram illustrating a result of detecting luminance by the OED sensor 63. As illustrated in the present embodiment, the result of detecting the luminance by the OED sensor 63 is illustrated as a graph in which a vertical axis indicates luminance (counts) and a horizontal axis indicates energy density (mJ/cm$^2$). The luminance detected by the OED sensor 63 indicates luminance of reflected light (reflected light reflected by the substrate 8) of light emitted from another light source.

Upon performing a preparation process (processing condition setting process) before performing a processing process (production process) of the substrate 8, the laser annealing apparatus 1 (laser irradiation apparatus) emits laser light a plurality of times at different energy densities within a predetermined energy density range. The predetermined energy density range is, for example, 390 to 450 (mJ/cm$^2$), and the OED sensor 63 detects luminance (counts) of each energy density of emitted laser light with resolution in units of 5 (mJ/cm$^2$). The energy density at which a highest luminance value (counts) is obtained among detected luminance values (counts) is specified as the optimum energy density. In the present embodiment, the highest luminance (counts), that is, the peak luminance, is 200 and the optimum energy density is specified as 435.

FIG. 4 is an explanatory diagram illustrating a result of detecting luminance by the unevenness monitor 64. As illustrated in the figure (table below) in the present embodiment, the result of detecting the luminance by the unevenness monitor 64 is illustrated as a graph in which a vertical axis indicates luminance (intensity) and a horizontal axis indicates energy density (mJ/cm$^2$). The luminance detected by the unevenness monitor 64 indicates the average luminance of the substrate 8 (region of interest) included in an image captured by the line camera. That is, the luminance detected by the unevenness monitor 64 and the luminance detected by the OED sensor 63 indicate different physical quantities.

Upon performing the preparation process (processing condition setting process), similarly to the OED sensor 63, the unevenness monitor 64 detects luminance (intensity) of each energy density of emitted laser light within a predetermined energy density range. As illustrated in the figure (upper table) in the present embodiment, the energy density of the laser light emitted within the predetermined energy density range is illustrated as first peak intensity of a pulse waveform and increases stepwise.

Based on the detection result by the unevenness monitor 64, the luminance (intensity) corresponding to the specified optimum energy density is specified as reference luminance. For example, when the optimum energy density is 435, the corresponding luminance (intensity) in the detection result by the unevenness monitor 64 is 148, and the corresponding luminance (intensity) becomes the reference luminance.

In this way, in the preparation process (processing condition setting process), the energy density is changed stepwise, laser light is emitted at different energy densities a plurality of times, and luminance of a substrate (irradiated body) at each energy density is detected by a different sensor (substrate measuring instrument) including the OED sensor 63 and the unevenness monitor 64. A detection result by the OED sensor 63 and the unevenness monitor 64 is stored in the storage unit 92 of the control device 9 in a graph format or a table format, for example, in association with the energy density and the luminance (counts, intensity).

Figure 5:
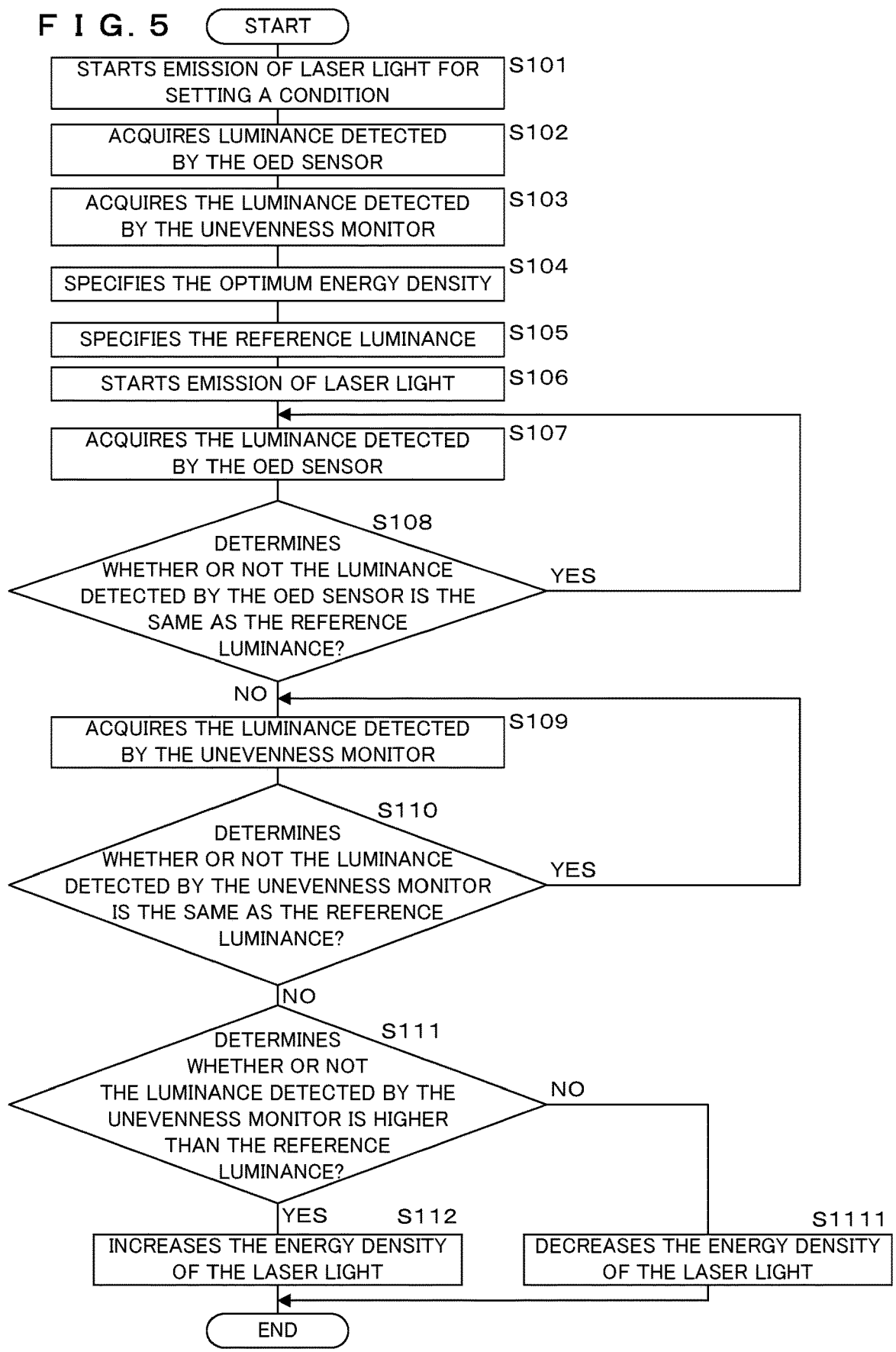
FIG. 5 is a flowchart illustrating an example of a processing procedure by a control unit.

FIG. 5 is a flowchart illustrating an example of a processing procedure by the control unit 91. The control unit 91 of the control device 9 included in the laser annealing apparatus 1 receives an operation of an operator by, for example, a keyboard connected to the input/output I/F 94, and performs the following processing based on the received operation.

The control unit 91 of the control device 9 starts emission of laser light for setting a condition (S101). Upon performing the preparation process (processing condition setting process) before performing the processing process (production process) of the substrate 8, the control unit 91 of the control device 9 starts emission of laser light a plurality of times with energy densities that are different stepwise within a predetermined energy density range.

The control unit 91 of the control device 9 acquires luminance detected by the OED sensor 63 (S102). The control unit 91 of the control device 9 acquires the luminance (counts) detected by the OED sensor 63 for each of laser light rays emitted at different energy densities stepwise, and associates and stores the energy densities and the luminance values (counts) in the storage unit 92 of the control device 9 in a graph format or a table format.

The control unit 91 of the control device 9 acquires the luminance detected by the unevenness monitor 64 (S103). The control unit 91 of the control device 9 acquires the luminance (intensity) detected by the unevenness monitor 64 for each of laser light rays emitted at different energy densities stepwise, and associates and stores the energy densities and the luminance values (intensity) in the storage unit 92 of the control device 9 in a graph format or a table format.

The control unit 91 of the control device 9 specifies the optimum energy density based on the luminance detected by the OED sensor 63 (S104). The control unit 91 of the control device 9 specifies the energy density at which the highest luminance value (counts) is obtained among the luminance values detected by the OED sensor 63 as the optimum energy density. The control unit 91 of the control device 9 stores the specified optimum energy density in the storage unit 92.

The control unit 91 of the control device 9 specifies the reference luminance based on the luminance detected by the unevenness monitor 64 and the optimum energy density (S105). The control unit 91 of the control device 9 specifies the luminance (intensity) corresponding to the optimum energy density as the reference luminance for the unevenness monitor 64 based on the detection result by the unevenness monitor. The control unit 91 of the control device 9 stores the specified reference luminance (reference luminance for the unevenness monitor 64) in the storage unit 92.

The control unit 91 of the control device 9 starts emission of laser light for processing the substrate 8 at the specified optimum energy density (S106). The control unit 91 of the control device 9 derives the transmittance of the attenuator 3 so as to have the specified optimum energy density, and outputs a control signal generated based on the derived transmittance to the attenuator 3. The attenuator 3 acquires (receives) the control signal output (transmitted) from the control device 9, and changes the transmittance according to the acquired control signal, so that laser light is emitted according to the optimum energy density. By being irradiated with the laser light according to the optimum energy density, the processing process (production process) of the substrate 8 is started.

The control unit 91 of the control device 9 acquires the luminance detected by the OED sensor 63 (S107). After laser light is emitted at the specified optimum energy density, the control unit 91 of the control device 9 continuously acquires the luminance of the substrate 8 (luminance of reflected light from another light source) from the OED sensor 63.

The control unit 91 of the control device 9 determines whether or not the luminance detected by the OED sensor 63 is the same as the reference luminance (S108). The control unit 91 of the control device 9 stores the highest luminance value (counts) among the luminance values used for specifying the optimum energy density in the processing of S104, that is, the luminance values detected by the OED sensor 63 in the storage unit 92 as the reference luminance for the OED sensor 63.

The control unit 91 of the control device 9 compares the luminance detected by the OED sensor 63 acquired in S107 with the reference luminance for the OED sensor 63 used in the processing of S104, and determines whether or not these values are the same. The fact that these values are the same is not limited to the case where these values are completely the same, and these values may be regarded as the same even when there is a difference due to an error range or a difference allowed in the processing accuracy of the substrate 8. That is, "the same" in this process means not only "the exact same" but also including the difference due to the error range and the difference allowed in the processing accuracy of the substrate 8.

When the values are the same (S108: YES), the control unit 91 of the control device 9 performs a loop process to execute the processing of S107 again.

When the values are not the same (S108: NO), the control unit 91 of the control device 9 acquires the luminance detected by the unevenness monitor 64 (S109). The control unit 91 of the control device 9 continuously acquires the luminance (average luminance of the region of interest) of the substrate 8 irradiated with laser light at the specified optimum energy density from the unevenness monitor 64.

The control unit 91 of the control device 9 determines whether or not the luminance detected by the unevenness monitor 64 is the same as the reference luminance (S110). The control unit 91 of the control device 9 compares the luminance acquired in the processing of S109 (luminance detected by the unevenness monitor 64) with the reference luminance specified in S105 (reference luminance for the unevenness monitor 64), and determines whether or not these values are the same. The fact that these values are the same is not limited to the case where these values are completely the same, and these values may be regarded as the same even when there is a difference due to an error range or a difference allowed in the processing accuracy of the substrate 8. That is, "the same" in this process means not only "the exact same" but also including the difference due to the error range and the difference allowed in the processing accuracy of the substrate 8.

When the values are the same (S110: YES), the control unit 91 of the control device 9 performs a loop process to execute the processing of S109 again. When the luminance acquired in the processing of S109 (luminance detected by the unevenness monitor 64) and the reference luminance specified in S105 are the same, the control unit 91 of the control device 9 determines that a fluctuation (shift) of the optimum energy density has not occurred, maintains the energy density at the present time, and continues emission of laser light.

When the values are not the same (S110: NO), the control unit 91 of the control device 9 determines whether or not the luminance detected by the unevenness monitor 64 is higher than the reference luminance (S111). When the luminance acquired in the processing of S109 (luminance detected by the unevenness monitor 64) and the reference luminance specified in S105 are not the same, the control unit 91 of the control device 9 determines that a fluctuation (shift) of the optimum energy density has occurred, and determines whether or not the luminance detected by the unevenness monitor 64 is higher than the reference luminance.

When the luminance is higher than the reference luminance (S111: YES), the control unit 91 of the control device 9 increases the energy density of laser light irradiating the substrate 8 (S112). When the luminance detected by the unevenness monitor 64 is higher than the reference luminance during the processing process (production process) of the substrate 8, the control unit 91 of the control device 9 increases the energy density of the laser light irradiating the substrate 8.

The control unit 91 of the control device 9 derives a transmittance higher than a transmittance of the attenuator 3 at the present time based on, for example, a difference (or a ratio) between (or of) the reference luminance and (or to) the luminance detected by the unevenness monitor 64, and outputs a control signal generated based on the derived transmittance to the attenuator 3. The attenuator 3 acquires (receives) the control signal output (transmitted) from the control device 9, and changes (increases) the transmittance according to the acquired control signal, so that the energy density of the laser light irradiating the substrate 8 is increased.

When the luminance is not higher than the reference luminance (S111: NO), that is, when the luminance is lower than the reference luminance, the control unit 91 of the control device 9 decreases the energy density of the laser light irradiating the substrate 8 (S1111). When the luminance detected by the unevenness monitor 64 is lower than the reference luminance during the processing process (production process) of the substrate 8, the control unit 91 of the control device 9 decreases the energy density of the laser light irradiating the substrate 8.

The control unit 91 of the control device 9 derives a transmittance lower than a transmittance of the attenuator 3 at the present time based on, for example, a difference (or a ratio) between (or of the reference luminance and (or to) the luminance detected by the unevenness monitor 64, and outputs the control signal generated based on the derived transmittance to the attenuator 3. The attenuator 3 acquires (receives) the control signal output (transmitted) from the control device 9, and changes (decreases) the transmittance according to the acquired control signal, so that the energy density of the laser light irradiating the substrate 8 is decreased.

The control unit 91 of the control device 9 ends a series of processes in this flow after executing the processing of S112 or S1111. Alternatively, the control unit 91 of the control device 9 may perform a loop process to execute the processing from S109 again after executing the processing of S112 or S1111, change the energy density based on the luminance, etc. detected by the unevenness monitor 64, and continuously respond to the fluctuation (shift) of the optimum energy density.

According to the present embodiment, upon performing the preparation process (processing condition setting process) before the processing process (production process) of the substrate 8, the laser annealing apparatus 1 (laser irradiation apparatus) uses a plurality of detection units based on the OED sensor 63 (first detection unit) and the unevenness monitor 64 (second detection unit) to emit laser light at different energy densities within a predetermined energy density range. The predetermined energy density range is, for example, 390 to 450 (mJ/cm$^2$), and the laser annealing apparatus 1 acquires luminance of each density of emitted energy using different detection units with resolution in units of 5 (mJ/cm$^2$).

The laser annealing apparatus 1 specifies the energy density at which a highest luminance value is obtained among luminance values detected by the OED sensor 63 (first detection unit) as the optimum energy density, and specifies, as the reference luminance, luminance corresponding to the specified energy density (optimum energy density) among luminance values detected by the unevenness monitor 64 (second detection unit). The laser annealing apparatus 1 irradiating the substrate 8 with laser light at the specified energy density to start the processing process (production process) of the substrate 8, detects the luminance of the substrate 8 by the unevenness monitor 64 (second detection unit), and changes the energy density according to the luminance detected during the production process (luminance by the unevenness monitor 64) and the reference luminance specified in the preparation process.

In this way, even when the optimum energy density fluctuates due to a change in the pulse waveform during the production process (during gas life) of the substrate 8, it is possible to efficiently address the fluctuation (shift) of the optimum energy density by dynamically changing the energy density at which the substrate 8 is irradiated. Since the laser annealing apparatus 1 changes the energy density of the laser light by changing the transmittance of the attenuator 3, it is possible to efficiently address the fluctuation of the optimum energy density.

The optimum energy density (ED) that changes due to the change in the pulse waveform (including polarization) of the laser light has a strong dependence on a first peak of the pulse waveform. However, a detection result of the pulse waveform monitor (biplanar phototube 62) does not have to be a correct waveform. That is, the pulse waveform transmitted from the mirror (epi-illumination mirror 61) is measured only by P-polarized light, and thus is different from that of process light (P-polarized and S-polarized light) actually irradiated on the substrate 8. Therefore, by additionally using the OED sensor 63 and the unevenness monitor 64, which are two substrate sensors (detectors), it is possible to change the energy density (ED) through comprehensive determination from each of two detection values (feature amounts) detected by these two detectors and further from pulse waveform data.

According to the present embodiment, the laser annealing apparatus 1 increases the energy density of the laser light irradiating the substrate 8 when the luminance detected by the unevenness monitor 64 (second detection unit) during the production process (during gas life) of the substrate 8 is higher than the reference luminance, and decreases the energy density of the laser light irradiating the substrate 8 when the luminance is lower than the reference luminance. In this way, it is possible to accurately respond according to a fluctuation direction (shift to a positive side or a negative side) of the optimum energy density.

Since the optimum energy density uses a peak value of the luminance detected by the OED sensor 63 (first detection unit), it is difficult to determine whether the fluctuation direction of the optimum energy density is shifted to the positive side or the negative side only by the luminance detected by the OED sensor 63. On the other hand, by using different types of sensors including the OED sensor 63 (first detection unit) and the unevenness monitor 64 (second detection unit) in combination, it is possible to determine the fluctuation direction of the optimum energy density.

Other Embodiments

FIGS. 6, 7, 8, 9, and 10 are process sectional views illustrating a method of manufacturing a semiconductor device according to another embodiment (method of manufacturing a semiconductor device). As another embodiment, a description will be given of a method of manufacturing a semiconductor device using the laser annealing apparatus 1 according to the embodiment. In the method of manufacturing the semiconductor device below, an annealing process using the laser annealing apparatus 1 according to the first to fourth embodiments is performed in a process of crystallizing an amorphous semiconductor film.

The semiconductor device is a semiconductor device including a TFT (Thin Film Transistor), and in this case, an amorphous silicon film 84 can be crystallized by being irradiated with laser light to form a polysilicon film 85. The polysilicon film 85 is used as a semiconductor layer having a source region, a channel region, and a drain region of the TFT.

The laser annealing apparatus 1 according to the embodiment described above is suitable for manufacturing a TFT array substrate. Hereinafter, a method of manufacturing the semiconductor device having the TFT will be described.

First, as illustrated in FIG. 6, a gate electrode 82 is formed on a glass substrate 81 (substrate 8). As the gate electrode 82, for example, it is possible to use a metal thin film containing aluminum, etc. Subsequently, as illustrated in FIG. 7, a gate insulating film 83 is formed on the gate electrode 82. The gate insulating film 83 is formed so as to cover the gate electrode 82. Thereafter, as illustrated in FIG. 8, the amorphous silicon film 84 is formed on the gate insulating film 83. The amorphous silicon film 84 is disposed to overlap with the gate electrode 82 via the gate insulating film 83.

The gate insulating film 83 is a silicon nitride film (SiNx), a silicon oxide film ($SiO_2$ film), a laminated film thereof, etc. Specifically, the gate insulating film 83 and the amorphous silicon film 84 are continuously formed by a CVD (Chemical Vapor Deposition) method. The glass substrate 81 having the amorphous silicon film 84 serves as the semiconductor film in the laser annealing apparatus 1 (laser irradiation apparatus).

Figure 9:
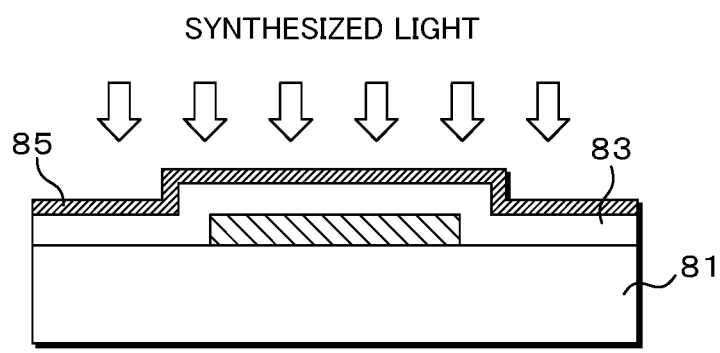
FIG. 9 is a process sectional view illustrating the method of manufacturing the semiconductor device according to the another embodiment (method of manufacturing the semiconductor device)

Then, as illustrated in FIG. 9, the amorphous silicon film 84 is crystallized by being irradiated with laser light L3 using the laser annealing apparatus 1 described above, thereby forming the polysilicon film 85. In this way, the polysilicon film 85 in which silicon is crystallized is formed on the gate insulating film 83. In performing this process, by performing a predetermined process disclosed in the first embodiment based on detection results from a plurality of types of substrate measuring instruments (detection units) including the OED sensor 63 and the unevenness monitor 64, the energy density at which the substrate 8 is irradiated may be changed according to the fluctuation of the optimum energy density, and the processing quality may be improved.

Thereafter, as illustrated in FIG. 10, an interlayer insulating film 86, a source electrode 87a, and a drain electrode 87b are formed on the polysilicon film 85. The interlayer insulating film 86, the source electrode 87a, and the drain electrode 87b can be formed using a general photolithography method or a film forming method. A subsequent manufacturing process differs depending on the device to be finally manufactured, and thus a description thereof will be omitted.

By using the method of manufacturing the semiconductor device described above, it is possible to manufacture a semiconductor device including a TFT including a polycrystalline semiconductor film. Such a semiconductor device is suitable for controlling a high-definition display such as an organic EL (Electro Luminescence) display. By suppressing unevenness of the polysilicon film 85 as described above, it is possible to manufacture a display device having excellent display characteristics with high productivity.

Note that the present disclosure is not limited to the above embodiments, and can be appropriately modified without departing from the spirit. For example, the present invention is not limited to the example in which the amorphous silicon film 84 is irradiated with laser light to form the polysilicon film 85, and the amorphous silicon film 84 may be irradiated with laser light to form a microcrystal silicon film. Further, an amorphous film other than the silicon film may be irradiated with laser light to form a crystallized film.

The embodiments disclosed this time should be considered to be exemplary in all respects and not restrictive. Technical features described in each example can be combined with each other and the scope of the invention is intended to include all modifications within the scope of the claims and scope equivalent to the scope of the claims.

It is to be noted that, as used herein and in the appended claims, the singular forms "a", "an", and "the" include plural referents unless the context clearly dictates otherwise.

It is to be noted that the disclosed embodiment is illustrative and not restrictive in all aspects. The scope of the present invention is defined by the appended claims rather than by the description preceding them, and all changes that fall within metes and bounds of the claims, or equivalence of such metes and bounds thereof are therefore intended to be embraced by the claims.

What is claimed is:

1. A laser irradiation apparatus including a laser light source, the laser irradiation apparatus comprising:
   a first detection unit and a second detection unit configured to detect luminance of a substrate irradiated with laser light from the laser light source; and
   a control unit configured to perform control related to laser light emitted from the laser light source,
   wherein the control unit performs a preparation process, which:

specifies an optimum energy density of laser light based on luminance detected by the first detection unit, and specifies a reference luminance based on luminance detected by the second detection unit at the optimum energy density, and wherein the control unit performs a production process, which:

changes an energy density of laser light according to luminance detected by the second detection unit as compared to the reference luminance.

2. The laser irradiation apparatus according to claim 1, wherein the control unit specifies the optimum energy density at which a highest luminance value is obtained among luminance values detected by the first detection unit.

3. The laser irradiation apparatus according to claim 1, wherein, when the substrate is irradiated with laser light at a specified energy density, the control unit increases an energy density of laser light irradiating the substrate when luminance detected by the second detection unit is higher than the reference luminance, and decreases an energy density of laser light irradiating the substrate when luminance detected by the second detection unit is lower than the reference luminance.

4. The laser irradiation apparatus according to claim 3, wherein the control unit increases an energy density of laser light irradiating the substrate by transmitting a control signal to an attenuator, wherein the attenuator increases the transmittance of laser light from the laser light source according to the control signal.

5. The laser irradiation apparatus according to claim 3, wherein the control unit decreases an energy density of laser light irradiating the substrate by transmitting a control signal to an attenuator, wherein the attenuator decreases the transmittance of laser light from the laser light source according to the control signal.

6. The laser irradiation apparatus according to claim 1, further comprising an attenuator configured to determine a transmittance of laser light emitted from the laser light source, wherein the control unit changes an energy density of laser light by changing a transmittance of the attenuator.

7. The laser irradiation apparatus according to claim 1, wherein the first detection unit includes an optical sensor configured to detect reflected light by the substrate, and acquires information related to a crystal surface on the substrate, and the second detection unit includes a camera configured to photograph a surface of the substrate, and acquires information related to scattered light of a surface shape of the substrate.

8. The laser irradiation apparatus according to claim 1, wherein the control unit specifies the optimum energy density by:

directing the laser light source to emit laser light a plurality of times at different energy densities within a predetermined energy density range, detecting luminance at each energy density value with the first detection unit, and selecting the energy density at which the highest value luminance is detected at the first detection unit.

9. The laser irradiation apparatus according to claim 8, wherein the control unit specifies the reference luminance by:

detecting luminance at each energy density value with the second detection unit, and selecting the reference luminance as the intensity of luminance at the second detection unit corresponding to the specified energy density.

10. The laser irradiation apparatus according to claim 1, wherein the control unit specifies the reference luminance by:

directing the laser light source to emit laser light a plurality of times at different energy densities within a predetermined energy density range, detecting luminance at each energy density value with the second detection unit, and selecting the reference luminance as the intensity of luminance at the second detection unit corresponding to the specified energy density.

11. The laser irradiation apparatus according to claim 1, wherein the control unit changes the energy density of laser light by transmitting a control signal to an attenuator, wherein the attenuator changes the transmittance of laser light from the laser light source according to the control signal.

12. The laser irradiation apparatus according to claim 1, wherein the second detection unit comprises a line camera.

13. A laser irradiation method causing a computer that performs control related to laser emitted from a laser light source and is communicably connected to a first detection unit and a second detection unit configured to detect luminance of a substrate irradiated with laser light from the laser light source to execute processes of:

performing a preparation process comprising:

(A) specifying an optimum energy density of laser light based on luminance detected by the first detection unit; and (B) specifying a reference luminance based on luminance detected by the second detection unit at the optimum energy density; and performing a production process comprising:

(C) changing an energy density of laser light according to luminance detected by the second detection unit as compared to the reference luminance when a substrate is irradiated with laser light at a specified energy density.

14. A recording medium recording a program to be readable, the program causing a computer that performs control related to laser emitted from a laser light source and is communicably connected to a first detection unit and a second detection unit configured to detect luminance of a substrate irradiated with laser light from the laser light source to execute processes of:

performing a preparation process comprising:

(A) specifying an optimum energy density of laser light based on luminance detected by the first detection unit; and (B) specifying a reference luminance based on luminance detected by the second detection unit at the optimum energy density; and performing a production process comprising:

(C) changing an energy density of laser light according to luminance detected by the second detection unit as compared to the reference luminance when a substrate is irradiated with laser light at a specified energy density.

* * * * *